United States Patent
Zhang

(10) Patent No.: US 6,783,369 B2
(45) Date of Patent: Aug. 31, 2004

(54) PICK-UP CAP FOR ELECTRICAL CONNECTOR

(75) Inventor: Xue Bin Zhang, Kunsan (CN)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 10/436,562

(22) Filed: May 12, 2003

(65) Prior Publication Data

US 2004/0097104 A1 May 20, 2004

(30) Foreign Application Priority Data

Nov. 15, 2002 (TW) .................................. 91218345 U

(51) Int. Cl.⁷ .............................................. H01R 13/60
(52) U.S. Cl. ......................... 439/41; 439/135; 439/940
(58) Field of Search ........................ 439/41, 940, 342, 439/259, 135

(56) References Cited

U.S. PATENT DOCUMENTS

| | | | |
|---|---|---|---|
| 5,688,133 A | * | 11/1997 | Ikesugi et al. .............. 439/135 |
| 6,413,111 B1 | | 7/2002 | Pickles et al. |
| 6,439,901 B1 | * | 8/2002 | Ji et al. ....................... 439/135 |
| 6,478,588 B1 | | 11/2002 | Howell et al. |
| 6,533,592 B1 | | 3/2003 | Chen et al. |

* cited by examiner

Primary Examiner—Tho D. Ta
Assistant Examiner—James R. Harvey
(74) Attorney, Agent, or Firm—Wei Te Chung

(57) ABSTRACT

A pick-up cap (1) is for facilitating manipulation of an electrical connector (2) on an electric apparatus. The pick-up cap includes a suction portion (11) to be sucked by a vacuum suction nozzle. A rectangular positioning portion (13) is formed at one end of the suction portion. A pair of spaced positioning arms (12) is formed at an opposite end of the suction portion. Each positioning arm has a bulge (121) extending from a free end thereof, toward the connector. The positioning portion has a pair of side blocks (131) and a positioning block (133) defined thereon, toward the connector. When the pick-up cap is mounted on the connector, a geometric center 'c' of the suction portion of the pick-up cap coincides with a center of gravity 'g' of the connector.

18 Claims, 5 Drawing Sheets

PICK-UP CAP FOR ELECTRICAL CONNECTOR

BACKGROUND OF THE INVENTION

1. Field of the Invention

The present invention relates to the art of electrical connectors, and particularly to a pick-up cap for facilitating manipulation of an electrical connector onto an electronic apparatus.

2. Description of Prior Art

On a typical electrical goods production line, electronic components such as electrical connectors require manipulation by means of a vacuum suction nozzle for proper positioning onto electronic apparatuses such as printed circuit boards. A pick-up cap can be mounted on many types of electrical connectors, the pick-up cap having a suction portion. The vacuum suction nozzle engages the suction portion of the pick-up cap and thereby picks up the electrical connector.

FIG. 6 shows a conventional pick-up cap 9. An electrical connector 8 defines an opening (not shown) in a middle thereof, and a head portion 83 formed at one end thereof. An actuation device 82 is mounted on the head portion 83. The pick-up cap 9 is substantially rectangular and is received in the opening of the connector 8. The pick-up cap 9 comprises a suction portion 91. A geometric center of the suction portion 91 of the pick-up cap 9 represented by 'a' is located over the opening of the connector 8. A center of gravity of the connector 8 represented by 'b' is near the head portion, far from the opening of the connector 8. Thus the geometric center 'a' of the suction portion 91 of the pick-up cap 9 does not coincide with the center of gravity 'b' of the connector 8.

As a result, when a vacuum suction nozzle (not shown) picks up the connector 8 by sucking the suction portion 91 of the pick-up cap 9, the connector 8 is liable to tilt with respect to the pick-up cap 9. This can result in a gap being opened between the vacuum suction nozzle and the pick-up cap 9, and leakage of air into the vacuum suction nozzle. If the leakage is substantial, the connector 8 together with the pick-up cap 9 falls off from the vacuum suction nozzle.

In view of the above, a new pick-up cap that overcomes the above-mentioned disadvantages is desired.

SUMMARY OF THE INVENTION

Accordingly, an object of the present invention is to provide a pick-up cap for facilitating manipulation of an electrical connector onto an electronic apparatus, whereby the pick-up cap can reliably engage with a vacuum suction nozzle.

To achieve the above-mentioned object, a pick-up cap in accordance with a preferred embodiment of the present invention is for facilitating manipulation of an electrical connector onto an electronic apparatus. The pick-up cap comprises a suction portion to be sucked by a vacuum suction nozzle. A rectangular positioning portion is formed at one end of the suction portion. A pair of spaced positioning arms are formed at an opposite end of the suction portion. Each positioning arm has a bulge extending from a free end thereof, toward the connector. The positioning portion has a pair of side blocks and a positioning block defined thereon, toward the connector. When the pick-up cap is mounted on the connector, a geometric center of the suction portion of the pick-up cap coincides with a center of gravity of the connector. Thus, when the vacuum suction nozzle sucks the pick-up cap, the connector is prevented from falling off from the pick-up cap. This ensures a reliable sucking manipulation.

Other objects, advantages and novel features of the invention will become more apparent from the following detailed description when taken in conjunction with the accompanying drawings, in which:

DETAILED DESCRIPTION OF PREFERRED EMBODIMENT OF THE INVENTION

Reference will now be made to the drawings to describe the present invention in detail.

Figure 1:
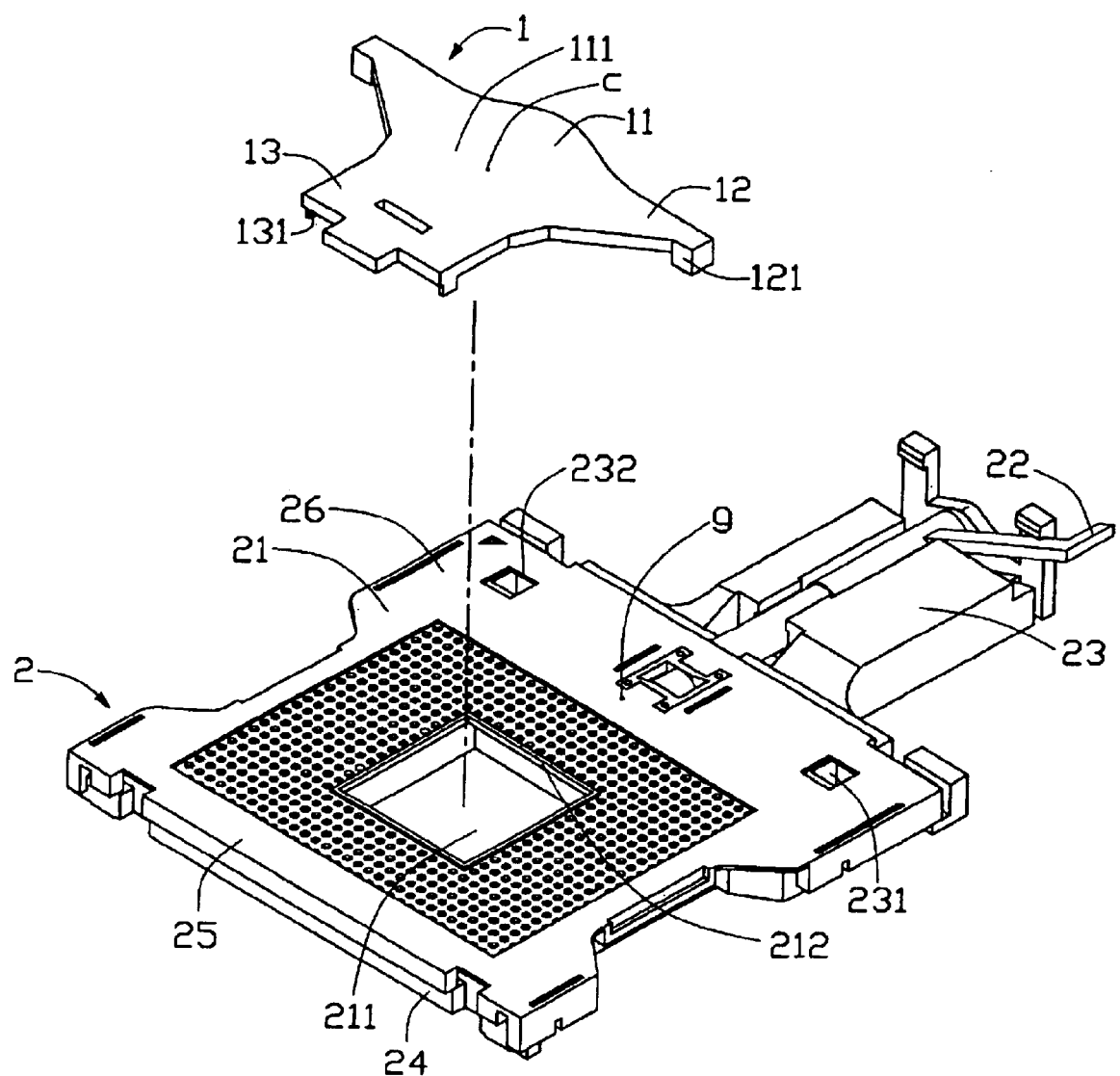
FIG. 1 is an isometric view of a pick-up cap in accordance with the preferred embodiment of the present invention, and showing the pick-up cap ready to be attached to an electrical connector.
Figure 2:
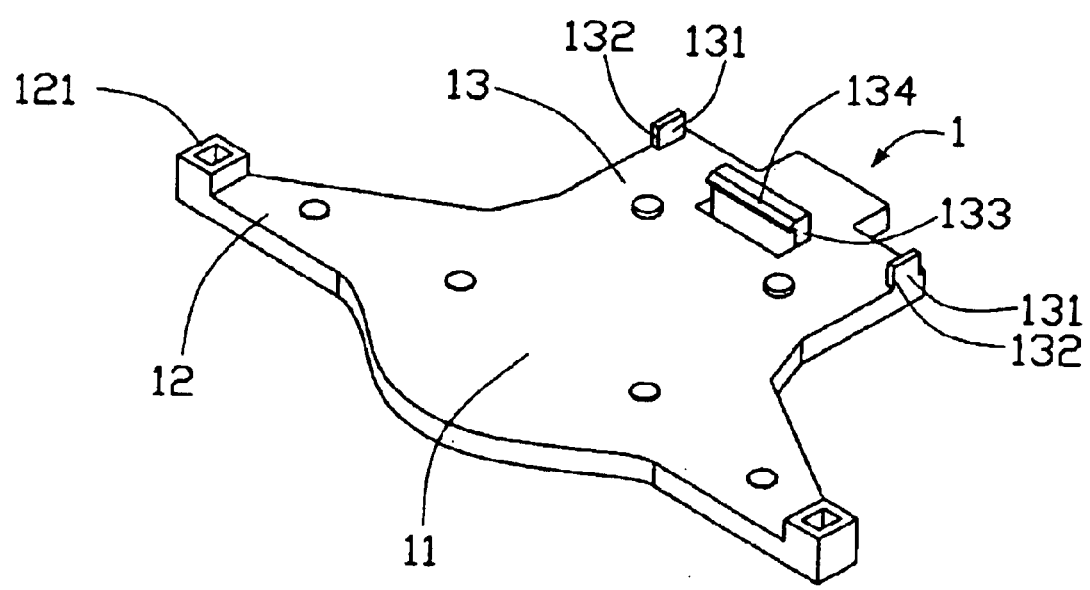
FIG. 2 is a view of the pick-up cap of FIG. 1 inverted.

Referring to FIGS. 1 and 2, an electrical connector 2 comprises an insulative housing 21, an actuation device 22, and a plurality of conductive terminals (not shown) received in the housing 21.

The housing 21 comprises a body portion 26, and a head portion 23 extending from an end of the body portion 26. The body portion 26 defines a rectangular opening 211 in a middle thereof, a conductive component region surrounding the opening 211, and a pair of spaced locating holes 231 between the conductive component region and the head portion 23. The opening 211 is bounded by an interferential wall 212 and the contact area (not labeled) around said interferential wall 212. Each locating hole 231 is bounded by a locating wall 232 that is parallel to the interferential wall 212. The body portion 26 comprises a base 24, and a cover 25 attached on the base 24. The actuation device 22 can drive the cover 25 to slide along the base 24. A clearance (not shown) is defined between the base 24 and the cover 25, for minimizing friction force produced when the cover 25 is slid along the base 24.

Figure 3:
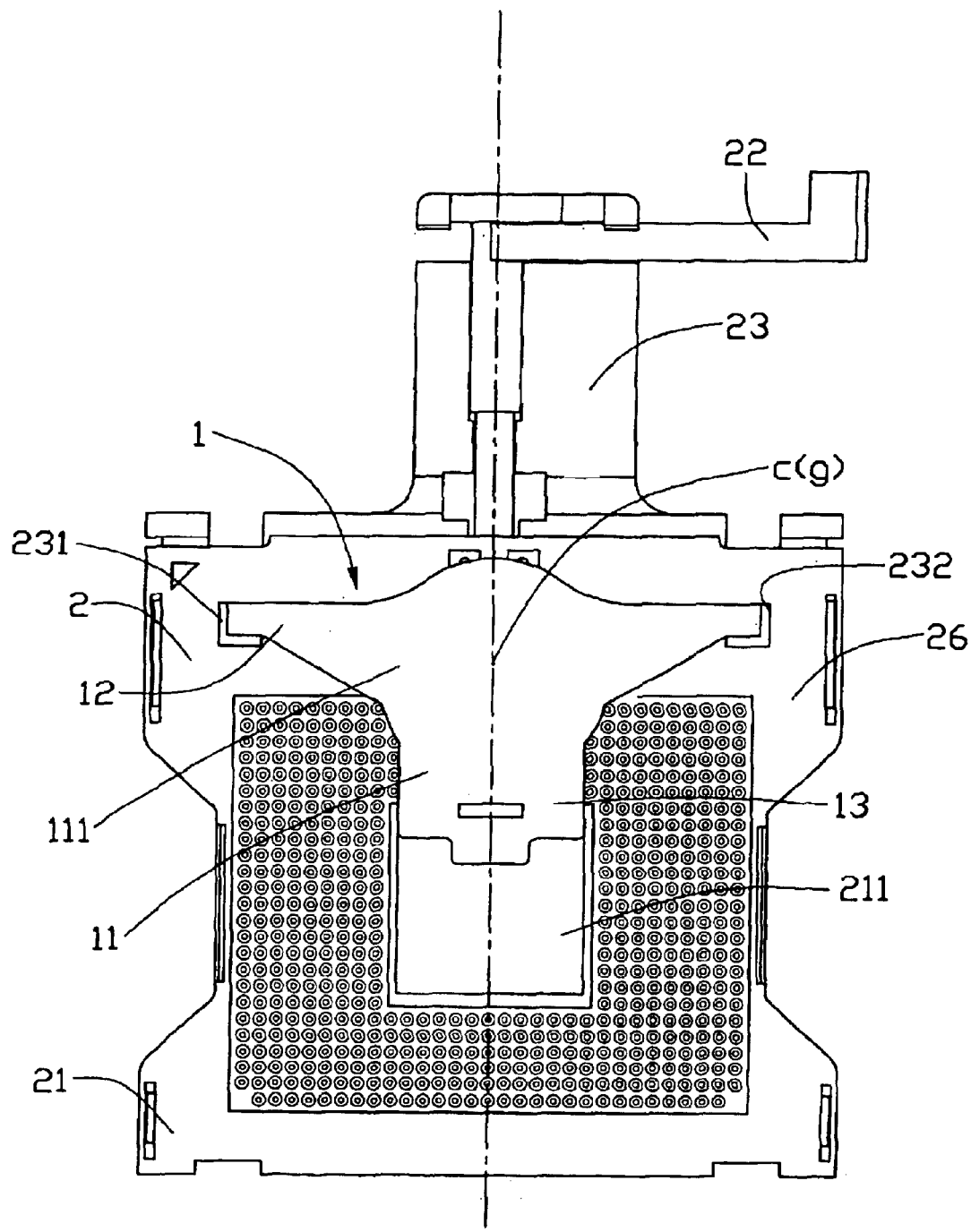
FIG. 3 is a top elevation assembled view of FIG. 1.

The actuation device 22 is mounted on the head portion 23 of the housing 21 and can rotate with respect to the housing 21 between an open position and a closed position. Referring to FIG. 3, the actuation device 22 is located at the open position with a handle of the actuation device 22 being located at right side of a central line of the housing 21 and being locked by a latch formed on the header portion 23. Because the head portion 23 is relatively large and has the actuation device 22 mounted thereon, a center of gravity of the connector 2 about Z-axis (axis projecting into the paper, represented by 'g' in FIG. 1) in the body portion 26 when the actuation device is at the open position is defined near the head portion 23.

A pick-up cap 1 in accordance with a preferred embodiment of the present invention is for facilitating manipulation of the connector 2 on an electronic apparatus (not shown). The pick-up cap is substantially lamelliform, and comprises a suction portion 11, a rectangular positioning portion 13 formed at one end of the suction portion 11, and a pair of opposite positioning arms 12 formed at an opposite end of the suction portion 11. A width of the positioning portion 13 is substantial equal to that of the opening 211 of the connector 2.

The suction portion 11 of the pick-up cap 1 comprises a suction surface 111 opposite from the connector 2. The suction surface 111 is polished and planar, for facilitating suction engagement with a vacuum suction nozzle (not shown).

Each positioning arm 12 has a bulge 121 extending from a free end thereof toward the connector 2. The bulge 121 is hollow.

The positioning portion 13 has a pair of spaced side blocks 131 respectively extending from opposite sides thereof toward the connector 2, and a positioning block 133 formed between the side blocks 131. Each side block 131 defines a locating surface 132. The two locating surfaces 132 of the two side blocks 131 are coplanar. The positioning block 133 has a hook 134 formed on a free end thereof.

Figure 4:
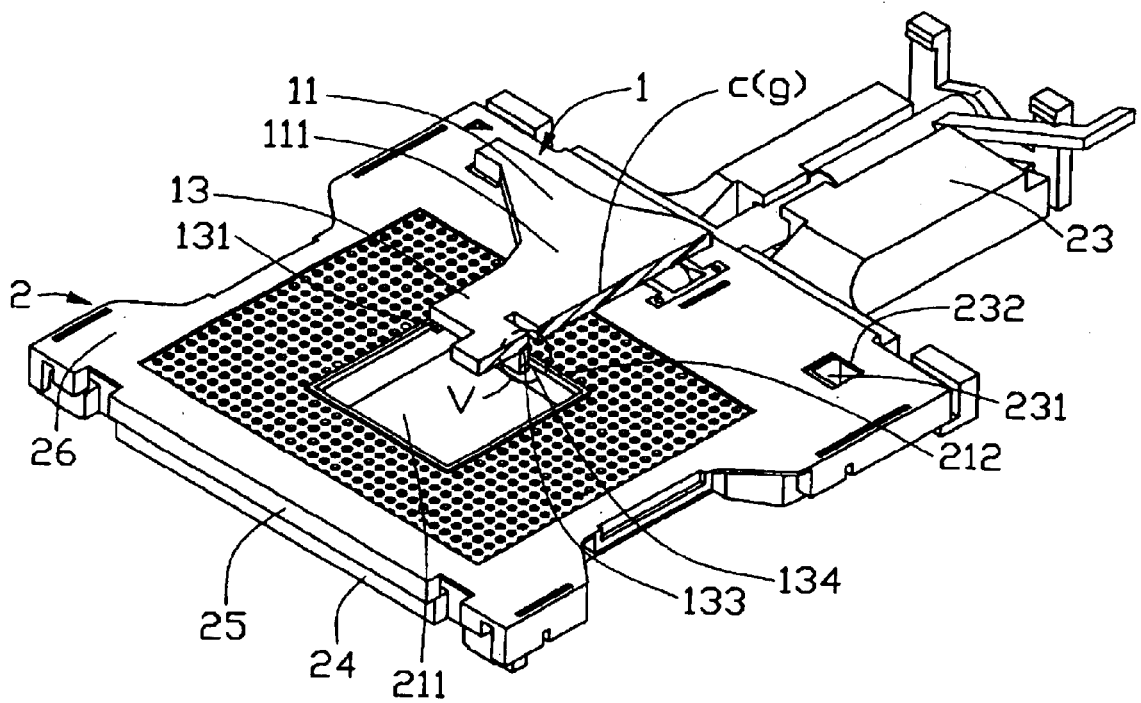
FIG. 4 is an assembled view of FIG. 1, with half of the pick-up cap cut away.
Figure 5:
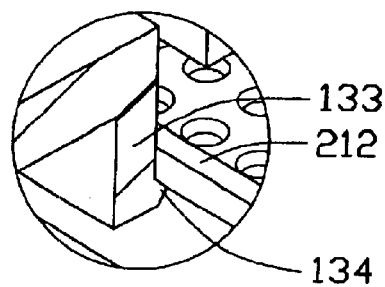
FIG. 5 is an enlarged view of a circled portion V of FIG. 4.
Figure 6:
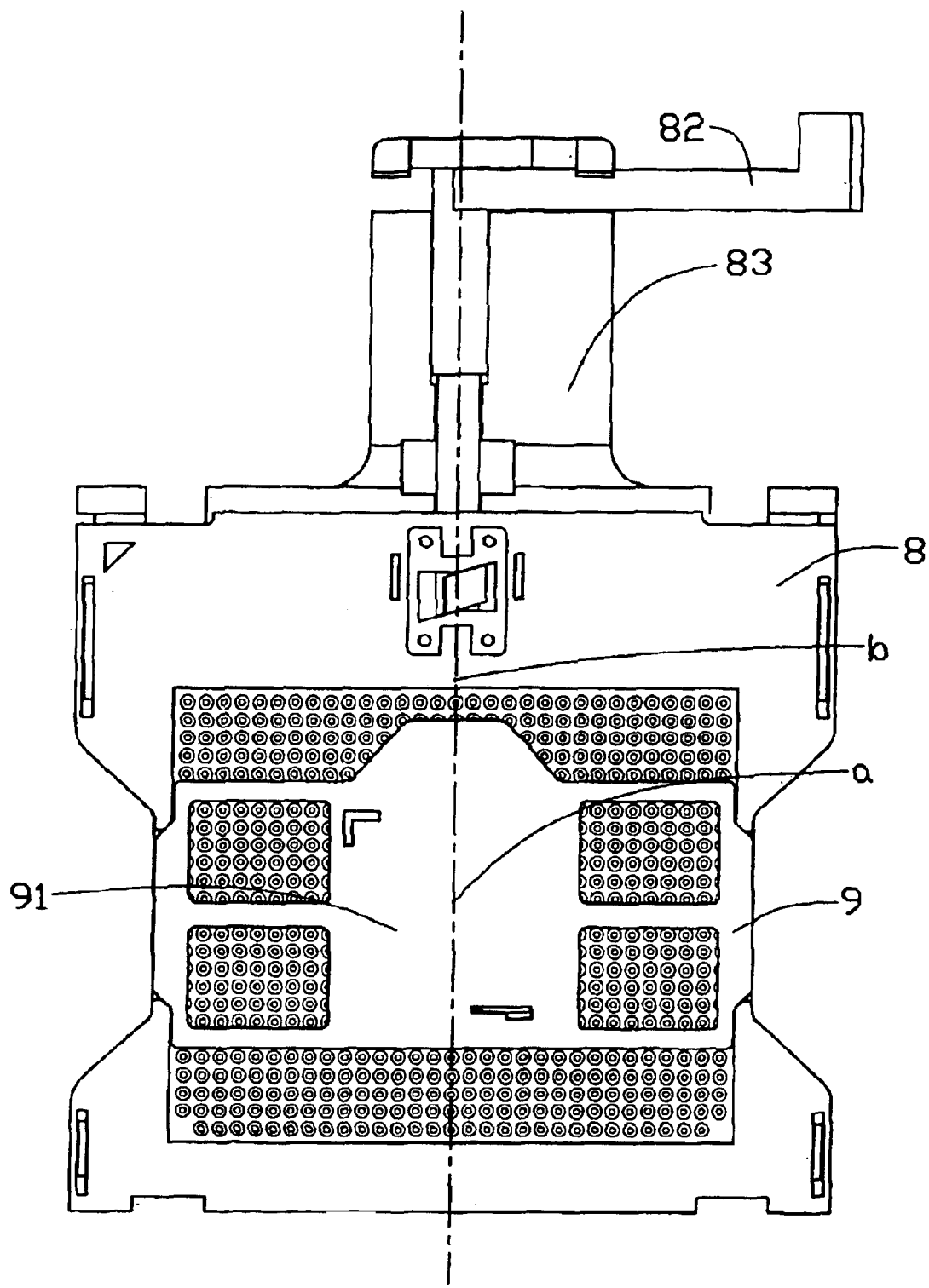
FIG. 6 is a top elevation view of a conventional pick-up cap attached to an electrical connector.

Referring also to FIGS. 3, 4 and 5, the actuation device 22 is at a closed position, and the pick-up cap 1 is mounted on the connector 2. During this process, the bulges 121 of the positioning arms 12 are respectively received in the corresponding locating holes 231, and the hook 134 is forcibly outwardly deflected to pass over the edge of the cover 25 to latchably engage under the underside of the cover 25. The bulges 121 of the pick-up cap 1 interferentially engage with the locating walls 232 at the corresponding locating holes 231 of the connector 2. The locating surfaces 132 of the side blocks 131 of the pick-up cap 1 interferentially engage with the interferential wall 212 at the opening 211 of the connector 2.

The positioning arms 12 of the pick-up cap 1 are thus positioned on the base portion 26 of the connector 2, near the head portion 23. In addition, a geometric center of the suction portion 11 of the pick-up cap 1 represented by 'c' coincides with the center of gravity 'g' of the connector 2. Thus the pick-up cap 1 is stably mounted on the connector 2. This ensures that the vacuum suction nozzle can reliably engage with the connector 2 via the suction portion 11 of the pick-up cap 1.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. A pick-up cap for facilitating manipulation of an electrical connector on an electronic apparatus, the pick-up cap comprising:
   a suction portion having a suction surface defined thereon; and
   a pair of spaced positioning arms extending from one end of the suction portion;
   a positioning block extending from the other end of the suction portion and having a hook formed at a free end thereof;
   wherein the other end of the suction portion is located at an opening of the connector with the hook of the positioning block lachably engaging with interferential wall of the opening, and a geometric center of the suction portion of the pick-up cap about X-axis coincides with a center of gravity of the connector about X-axis when the connector is at an open position.

2. The pick-up cap as claimed in claim 1, wherein the positioning arms are located on a base portion of the connector, near a head portion of the connector, and each positioning arm has a bulge extending from a free end thereof, toward the connector.

3. The pick-up cap as claimed in claim 2, wherein the bulges are located in corresponding locating holes of the connector, and interferentially engage with locating walls of the corresponding locating holes of the connector.

4. The pick-up cap as claimed in claim 3, wherein the bulges are substantial rectangular and hollow.

5. The pick-up cap as claimed in claim 1, wherein the suction portion has a pair of spaced side blocks formed thereon, the position block being located substantially at a middle of the two side blocks.

6. The pick-up cap as claimed in claim 5, wherein the side blocks interferentially engage with interferential wall at the body portion of the connector.

7. An electrical connector assembly comprising:
   an electrical connector including a body portion, a head portion extending from an end of the body portion, an opening defined on the body portion, and a pair of spaced locating holes defined on one end of the body portion between the opening and the header portion; and
   a pick-up cap mounted on the connector and comprising a suction portion and a pair of spaced positioning arms extending from one end of the suction portion and positioned in th locating holes, respectively;
   wherein the connector further includes an actuation device which can rotate between an open position and a closed position, and a geometric center of the suction portion of the pick-up cap about X-axis coincides with a center of gravity of the connector about X-axis when the actuation device is at the open position.

8. The electrical connector assembly as claimed in claim 7, wherein each positioning arm has a bulge extending from a free end thereof, and the bulge is located in the corresponding locating hole of the connector.

9. The electrical connector assembly as claimed in claim 8, wherein each locating hole of the connector comprises a locating wall the corresponding bulge of the pick-up cap interferentially engages with the locating wall.

10. The electrical connector assembly as claimed in claim 9, wherein the bulges are substantial rectangular and hollow.

11. The electrical connector assembly as claimed in claim 7, wherein the suction portion of the pick-up cap has a pair of spaced side blocks and a positioning block defined on the other end thereof, and the side blocks and the p block are located at the opening of the base portion of the connector.

12. The electrical connector assembly as claimed in claim 11, wherein the side blocks extend from the suction portion, and the positioning block is formed between the side blocks.

13. The electrical connector assembly as claimed in claim 12, wherein the body portion of the connector comprises a base and a cover, with a clearance defined therebetween, and the opening of the connector defines an interferential wall.

14. The electrical connector assembly as claimed in claim 13, wherein the positioning block of the pick-up cap has a hook formed on a free end thereof, and the hook is received in the clearance of the body portion of the connector.

15. The electrical connector assembly as claimed in claim 14, wherein the side blocks interferentially engage with the interferential wall of the opening of the connector.

16. The electrical connector assembly as claimed in claim 15, wherein the suction portion of the pick-up cap forms a substantially rectangular positioning portion at the other end thereof, and the side blocks and the positioning block are formed on the positioning portion.

17. An electrical connector assembly comprising:

a body portion and a head portion positioned in front of the body portion;

an actuation device located on the head portion, the body portion including a base and a cover stacked on the base and moveable relative to the base in a front-to-back direction by said actuation device, the body portion defining an opening generally located in a center portion thereof and surrounded by a matrix like contact area thereof; and a suction cap attached to the body portion and providing a suction plane substantially only covering a region of the body portion. located between the head portion and the opening wherein a geometry center of the suction cap is generally vertically aligned with a gravity center of the connector; wherein a portion of said contact area is included in said region.

18. The electrical connector assembly as claimed in claim 17, wherein said head portion extends about at least one half of a dimension of the body portion along said front-to-back direction.

* * * * *